United States Patent
Koide et al.

(10) Patent No.: US 8,927,874 B2
(45) Date of Patent: Jan. 6, 2015

(54) FLEXIBLE WIRING SUBSTRATE, METHOD FOR ASSEMBLING FLEXIBLE WIRING SUBSTRATE, AND METHOD FOR MANUFACTURING LIQUID JETTING APPARATUS

(75) Inventors: Shohei Koide, Nagoya (JP); Yusuke Suzuki, Nishio (JP); Mizuyo Kawano, Nagoya (JP); Hiromitsu Mizutani, Ichinomiya (JP)

(73) Assignee: Brother Kogyo Kabushiki Kaisha, Aichi-ken (JP)

( * ) Notice: Subject to any disclaimer, the term of this patent is extended or adjusted under 35 U.S.C. 154(b) by 230 days.

(21) Appl. No.: 13/368,520

(22) Filed: Feb. 8, 2012

(65) Prior Publication Data
US 2012/0247816 A1 Oct. 4, 2012

(30) Foreign Application Priority Data

Mar. 28, 2011 (JP) ................. 2011-070072

(51) Int. Cl.
*H05K 1/00* (2006.01)
*B41J 2/14* (2006.01)
*H05K 1/02* (2006.01)

(52) U.S. Cl.
CPC .......... *B41J 2/14233* (2013.01); *H05K 1/0268* (2013.01); *B41J 2002/14266* (2013.01); *B41J 2002/14459* (2013.01); *B41J 2002/14491* (2013.01); *H05K 1/028* (2013.01); *H05K 1/0293* (2013.01); *H05K 2201/056* (2013.01)
USPC ......................................... 174/254; 361/749

(58) Field of Classification Search
CPC . H05K 1/0268; H05K 1/0269; H05K 1/0275; H05K 1/0393; H05K 2203/162
USPC ................... 174/254; 361/749–751
See application file for complete search history.

(56) References Cited

U.S. PATENT DOCUMENTS

| 5,629,239 A * | 5/1997 | DiStefano et al. ............... 216/14 |
| 6,888,229 B2 * | 5/2005 | DiStefano et al. ............ 257/666 |
| 2009/0309930 A1 | 12/2009 | Tamura et al. |

FOREIGN PATENT DOCUMENTS

| JP | 2001-196704 | 7/2001 |
| JP | 2003266687 | 9/2003 |
| JP | 2005-285887 | 10/2005 |
| JP | 2006-142504 | 6/2006 |
| JP | 2009-56662 | 3/2009 |
| JP | 2009-056662 | 3/2009 |
| JP | 2010023480 | 2/2010 |
| JP | 2011-011357 | 1/2011 |

OTHER PUBLICATIONS

Decision to Grant a Patent issued for Japanese Patent Application No. 2011-070072 dated Jan. 29, 2013.

* cited by examiner

*Primary Examiner* — Jeremy C Norris
(74) *Attorney, Agent, or Firm* — Frommer Lawrence & Haug LLP

(57) ABSTRACT

A flexible wiring substrate includes: a flexible base material; a wire provided on the base material; and an inspection wire provided on the base material, having an inspection segment which breaks up under a condition that the inspection segment is folded with not less than a predetermined curvature and a non-inspection segment which does not break up under a condition that the non-inspection segment is folded with not less than the predetermined curvature.

8 Claims, 11 Drawing Sheets

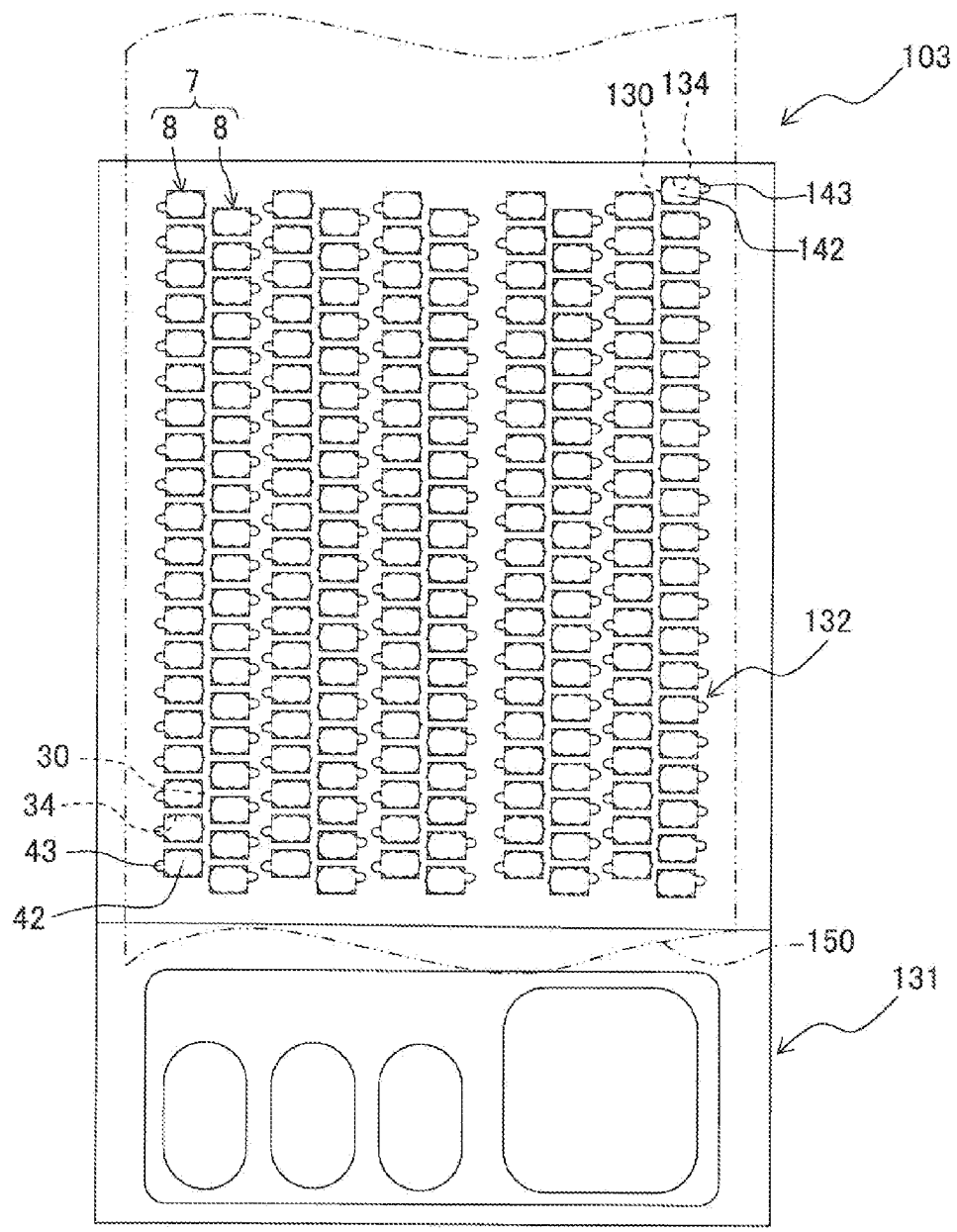

FLEXIBLE WIRING SUBSTRATE, METHOD FOR ASSEMBLING FLEXIBLE WIRING SUBSTRATE, AND METHOD FOR MANUFACTURING LIQUID JETTING APPARATUS

CROSS REFERENCE TO RELATED APPLICATION

The present application claims priority from Japanese Patent Application No. 2011-070072, filed on Mar. 28, 2011, the disclosure of which is incorporated herein by reference in its entirety.

BACKGROUND OF THE INVENTION

1. Field of the Invention

The present invention relates to flexible wiring substrates, methods for assembling flexible wiring substrates, and methods for manufacturing liquid jetting apparatuses.

2. Description of the Related Art

Flexible wiring substrates connected to connection objects and drawn out in a folded posture are conventionally known in various technical fields.

For example, Japanese Patent Application Laid-Open No. 2009-056662 discloses a flexible wiring member (a flexible wiring material) connected to an ink-jet head for jetting ink respectively from a plurality of nozzles. The ink-jet head has a piezoelectric actuator attached on the upper surface of the head body in which the plurality of nozzles are formed. Further, the upper surface of the actuator is connected with and covered by a flexible wiring substrate with wires formed on a flexible base material. The flexible wiring substrate is drawn out first in a planar direction parallel to the upper surface of the actuator beyond the edges of the actuator, and then folded in a direction perpendicular to the planar direction (an opposite direction to the actuator side).

However, if the flexible wiring substrate disclosed in the above Japanese Patent Application Laid-Open No. 2009-056662 is not folded at correct regions and thus not drawn around in a correct posture, then an excessive bending stress is applied to the flexible wiring substrate, which thereby becomes easily detachable from the connection object, and comes in the way of assembly of other members to make it difficult to assemble other members. Further, it is difficult to visually determine whether or not the flexible wiring substrate is drawn around in a correct posture.

SUMMARY OF THE INVENTION

Accordingly, an object of the present invention is to provide a flexible wiring substrate easily testable as to whether or not it is drawn around in a correct posture, a method for assembling the flexible wiring substrate, and a method for manufacturing a liquid jetting apparatus.

According to a first aspect of the present invention, there is provided a flexible wiring substrate including: a flexible base material; a wire provided on the base material; and an inspection wire provided on the base material, having an inspection segment which breaks up under a condition that the inspection segment is folded with not less than a predetermined curvature and a non-inspection segment which does not break up under a condition that the non-inspection segment is folded with not less than the predetermined curvature.

According to the first aspect of the present invention, it is possible to detect whether or not the region of the base material provided with the inspection segment is folded with not less than the predetermined curvature by inspecting whether or not the inspection wire is broken up. Therefore, it is possible to readily inspect whether or not the flexible wiring substrate in a single-piece state is drawn around in a correct posture according to the condition of the region of the base material provided with the inspection segment.

According to a second aspect of the prevent invention, there is provided a method for assembling a flexible wiring substrate configured to be connected to a connection object and have a first region to be folded with a predetermined curvature, the method including: connecting the flexible wiring substrate to the connection object; bending and folding the flexible wiring substrate; and determining whether or not the flexible wiring substrate is folded at the first region, wherein the flexible wiring substrate includes a flexible base material; a wire provided on the base material; and an inspection wire provided on the base material, and having an inspection segment which breaks up under a condition that the inspection segment is folded with not less than the predetermined curvature and a non-inspection segment which does not break up even under a condition that the non-inspection segment is folded with the predetermined curvature; and whether or not the flexible wiring substrate is folded at the first region is determined by inspecting whether or not the inspection wire is broken up.

According to the second aspect of the present invention, it is possible to inspect whether or not the flexible wiring substrate is folded at the region provided with the inspection segment by inspecting whether or not the inspection wire is broken up. Therefore, it is possible to determine whether or not the flexible wiring substrate is assembled in a correct posture.

According to a third aspect of the present invention, there is provided a method for manufacturing a liquid jetting apparatus including a flow passage unit which is formed with a liquid flow passage communicated with a nozzle for jetting a liquid, a liquid jetting head including an actuator having a drive electrode to apply jetting energy to the liquid in the liquid flow passage, and a flexible wiring substrate to be electrically connected to the drive electrode of the actuator and folded with a predetermined curvature, the method including: connecting the flexible wiring substrate to the liquid jetting head; bending and folding the flexible wiring substrate; and determining whether or not the flexible wiring substrate is folded with the predetermined curvature, wherein the flexible wiring substrate includes a flexible base material; a wire provided on the base material; and an inspection wire provided on the base material, and having an inspection segment which breaks up under a condition that the inspection segment is folded with not less than the predetermined curvature and a non-inspection segment which does not break up even under a condition that the non-inspection segment is folded with the predetermined curvature; and wherein the inspection wire is connected to the drive electrode of the actuator, and whether or not the flexible wiring substrate is folded with the predetermined curvature is determined by inspecting any breakup of the inspection segment based on whether or not the liquid is jetted from the nozzle corresponding to the drive electrode under a condition that an electric current is applied to the inspection wire.

According to the third aspect of the present invention, if the inspection wire is not broken up, then when an electric current is applied to the inspection wire, it flows on to the drive electrode, and thereby the liquid is jetted from the nozzle corresponding to the drive electrode. On the other hand, if the inspection wire is broken up, then when an electric current is applied to the inspection wire, it does not flow on to the electrode, and thereby the liquid is not jetted from the nozzle corresponding to the drive electrode. Therefore, it is possible to readily inspect whether or not the flexible wiring substrate is folded at a correct region and drawn around in a correct posture by inspecting whether or not the liquid is jetted from the nozzle of the liquid jetting head.

BRIEF DESCRIPTION OF THE DRAWINGS

FIG. 8 is a plan view of an ink-jet head in accordance with a first modification;

DESCRIPTION OF THE PREFERRED EMBODIMENT

Next, a preferred embodiment of the present invention will be explained. The embodiment is an example of applying the present invention to an ink-jet printer for jetting ink to a sheet of recording paper from an ink-jet head.

Figure 1:
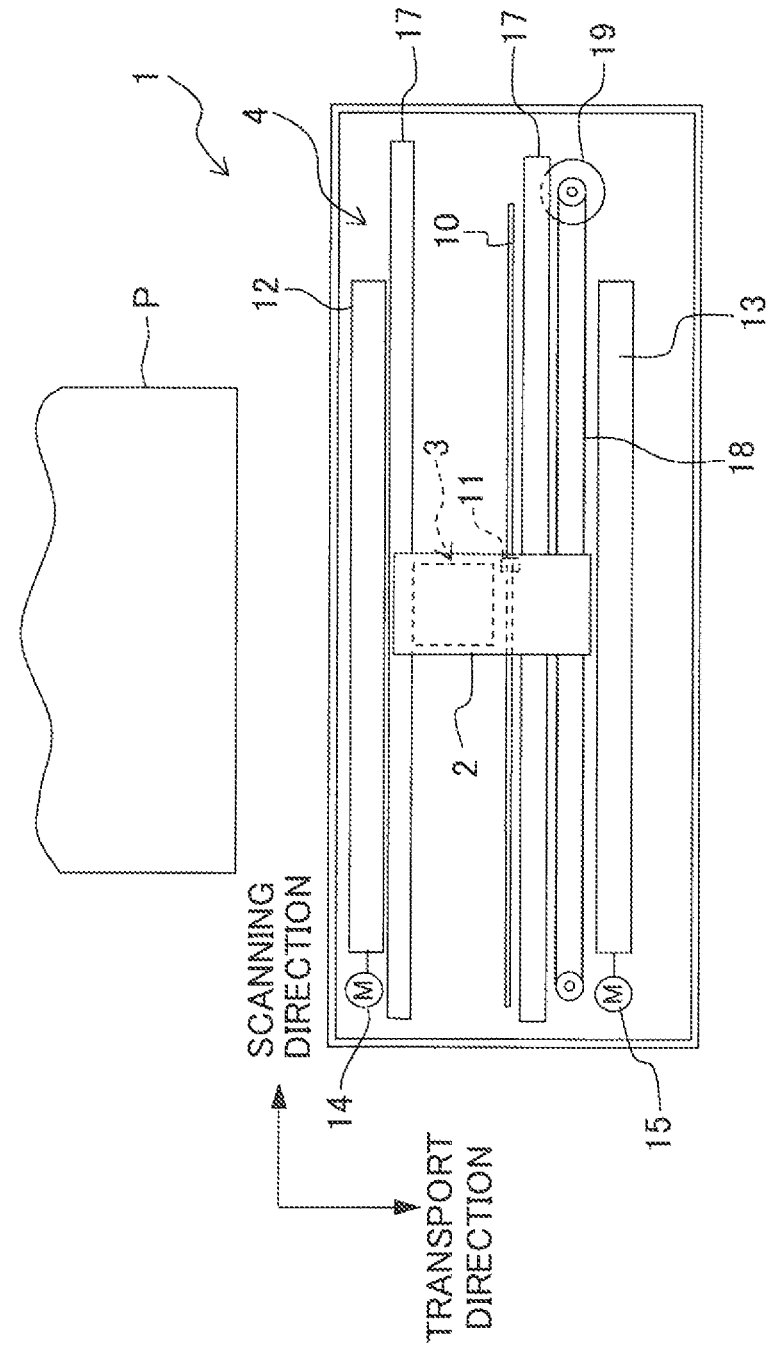
FIG. 1 is a schematic plan view of an ink-jet printer in accordance with an embodiment of the present invention.

First, referring to FIG. 1, explanations will be made with respect to a schematic configuration of the ink-jet printer of the embodiment. As shown in FIG. 1, a printer 1 (a liquid jetting apparatus) includes a carriage 2 configured to be reciprocatingly movable along a predetermined scanning direction (a horizontal direction in FIG. 1), an ink-jet head 3 installed on the carriage 2, a transport mechanism 4 for transporting a sheet of recording paper P in a transport direction (downward in FIG. 1) perpendicular to the scanning direction, and the like.

The carriage 2 is configured to be reciprocatingly movable along two guide shafts 17 extending parallel to the scanning direction. Further, the carriage 2 is connected to an endless belt 18 such that when a carriage drive motor 19 has driven the endless belt 18 to travel, the carriage 2 moves in the scanning direction along with the traveling of the endless belt 18.

Further, the printer 1 is provided with a linear encoder 10 having a number of light transmission portions (slits) aligned at intervals in the scanning direction. On the other hand, the carriage 2 is provided with a transmission-type photosensor 11 having light-emitting elements and light-receiving elements. Then, the printer 1 is capable of recognizing a present position of the carriage 2 in the scanning direction from a count value (the number of detections) of the light transmission portions of the linear encoder 10 detected by the photosensor 11 while the carriage 2 is in motion.

The ink-jet head 3 is installed on the carriage 2, and has a plurality of nozzles 30 (see FIGS. 3 and 4) in its lower surface (the surface on the back side of FIG. 1). The ink jet head 3 is configured to cause the plurality of nozzles 30 to jet the ink supplied from unshown ink cartridges to the recording paper P transported downward in FIG. 1 (the transport direction) by the transport mechanism 4.

The transport mechanism 4 has a paper feeding roller 12 arranged on the upstream side above the ink-jet head 3 in the transport direction, and a paper discharging roller 13 arranged on the downstream side below the ink-jet head 3 in the transport direction. The paper feeding roller 12 and the paper discharging roller 13 are driven to rotate by a paper feeding motor 14 and a paper discharging motor 15, respectively. Further, the transport mechanism 4 transports the recording paper P from the upper side of FIG. 1 toward the ink-jet head 3 by means of the paper feeding roller 12 and, at the same time, discharges the recording paper P on which images, characters and the like are recorded by the ink-jet head 3 to the lower side of FIG. 1 by means of the discharging roller 13.

Figure 2:
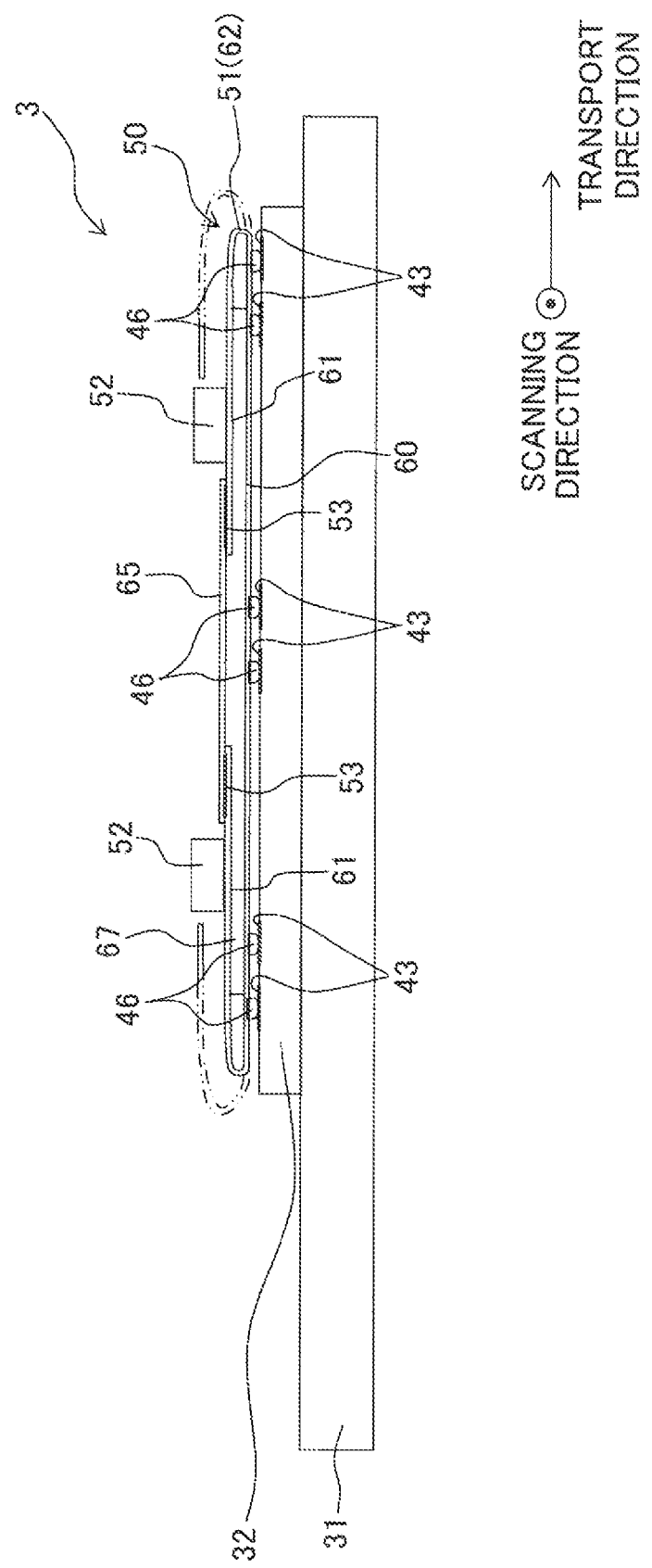
FIG. 2 is a lateral view of an ink jet head observed from a scanning direction.

Next, referring to FIGS. 2 to 4, the ink-jet head 3 will be explained. Further, FIG. 2 shows an example of a COF drawn around in an incorrect posture with chain double-dashed lines. Further, the plan view of the ink jet head illustrated in FIG. 3 shows a COF 50 arranged over an actuator 32 with a chain double-dashed line, while omitting the illustration of an FPC 65.

Figure 3:
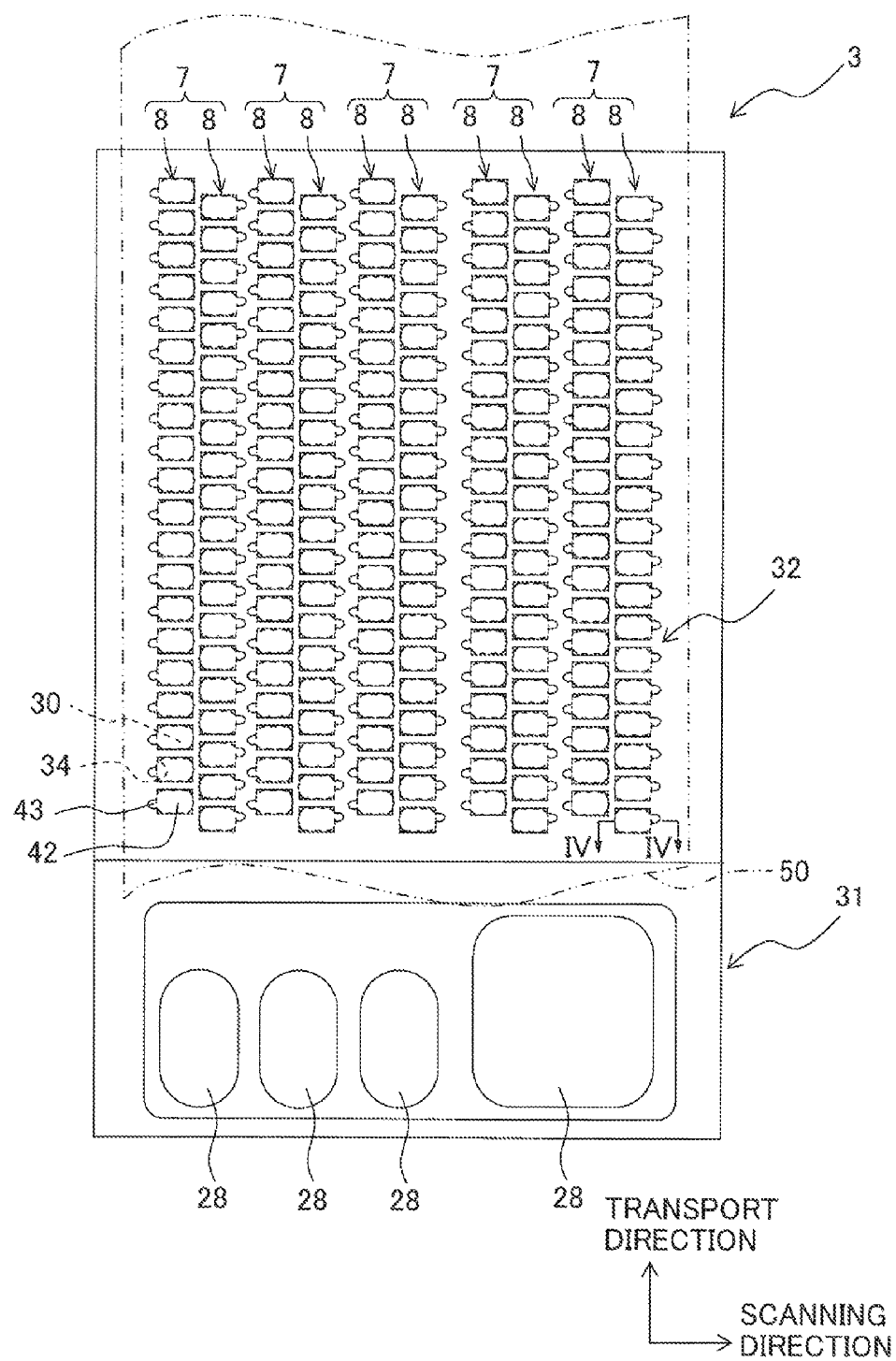
FIG. 3 is a plan view of a flow passage unit on which an actuator is arranged.
Figure 4:
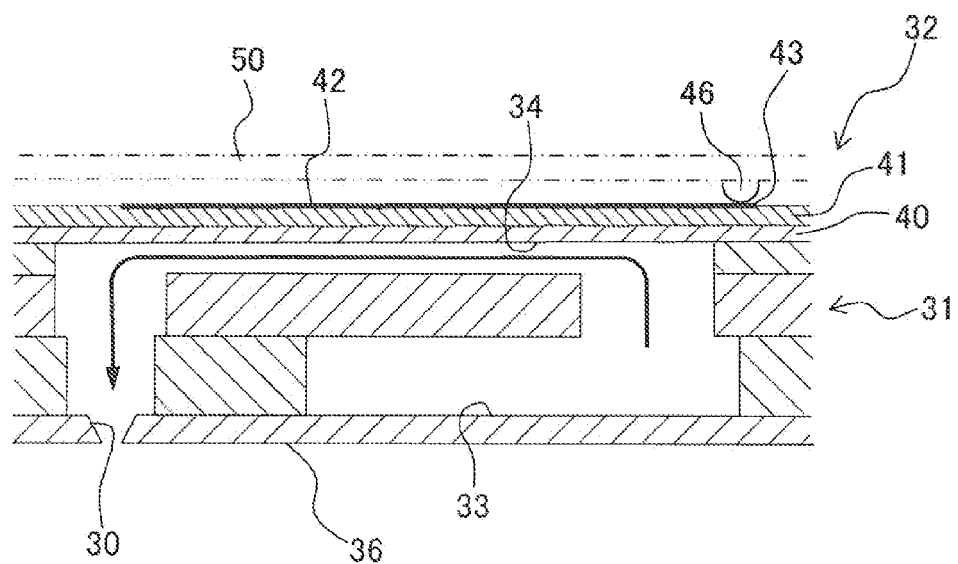
FIG. 4 is a cross-sectional view taken along the line IV-IV of FIG. 3.

As shown in FIGS. 2 to 4, the ink jet head 3 (the liquid jetting head) has a flow passage unit 31 in which ink flow passages are formed to include the nozzles 30, and the piezoelectric actuator 32 arranged on the upper surface of the flow passage unit 31 to apply a jetting pressure to the ink inside the ink flow passages, while on the upper surface of the actuator 32, the COF 50 is connected with the FPC 65. Further, the actuator 32 and COF 50 in the embodiment correspond to the actuator device in accordance with the present invention.

In the flow passage unit 31, there are formed four ink supply ports 28 connected respectively to four unshown ink cartridges, a manifold 33 being connected to each of the ink supply ports 28 and extending along the transport direction, a plurality of pressure chambers 34 in communication with each branch of the manifold 33, and the plurality of nozzles 30 in respective communication with the plurality of pressure chambers 34. The plurality of pressure chambers 34 are aligned along the manifold 33 extending in the paper feeding direction to form ten pressure chamber rows 8. Further, a pressure chamber group 7 is formed of two adjacent pressure chamber rows 8 in the scanning direction; thus, in the flow passage unit 31, totally five pressure chamber groups 7 are provided to align in the scanning direction. Further, among the five pressure chamber groups 7, the two pressure chamber groups 7 positioned on the right in FIG. 3 are the black pressure chamber groups 7 supplied with the black ink from the large ink supply port 28. Further, the three pressure chamber groups 7 positioned on the left in FIG. 3 are the color pressure chamber groups 7 supplied with the three color inks (yellow, magenta and cyan) from the other three ink supply ports 28, respectively.

The plurality of nozzles 30 in respective communication with the plurality of pressure chambers 34 pass through the lower surface of the flow passage unit 31, and are aligned in the same manner as the plurality of pressure chambers 34. On the right in FIG. 3, two nozzle groups are arranged in respective correspondence with the two pressure chamber groups 7 to jet the black ink, while on the left in FIG. 3, three nozzle groups are arranged in respective correspondence with the three pressure chamber groups 7 to jet the three color inks.

The actuator 32 has a vibration plate 40 joined together with the flow passage unit 31 to cover the plurality of pressure chambers 34, a piezoelectric layer 41 arranged on the upper surface of the vibration plate 40, a plurality of individual electrodes 42 provided on the upper surface of the piezoelectric layer 41 to correspond to the plurality of pressure chambers 34, and a plurality of input contact points 43 formed at end portions of the plurality of individual electrodes 42.

When a predetermined drive signal is supplied to an individual electrode 42 from an aftermentioned driver IC 52 of the COF 50, the actuator 32 utilizes a piezoelectric strain arising in the piezoelectric layer 41 to give rise to a flexural deformation in the vibration plate 40. This flexural deformation of the vibration plate 40 brings about a change in the volume of the corresponding pressure chamber 34. Thereby, a pressure is applied to the ink inside the pressure chamber 34 so as to jet the same from the nozzle 30 in communication with the pressure chamber 34. The plurality of input contact points 43 are arranged to align at predetermined intervals in the paper feeding direction to correspond to the plurality of nozzles 30 and, meanwhile, arranged to align in rows in the scanning direction.

Figure 5:
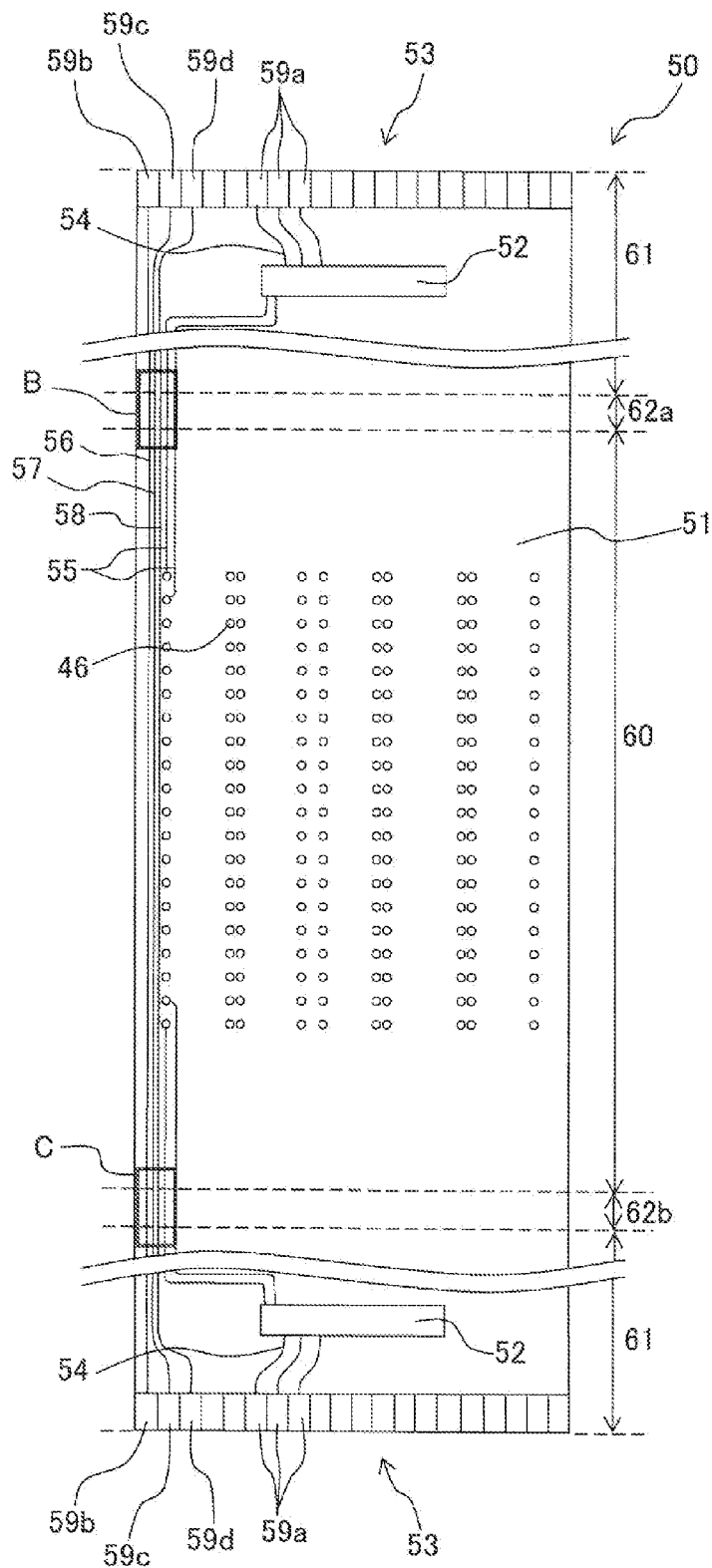
FIG. 5 is a plan view of a COF.
Figure 6A:
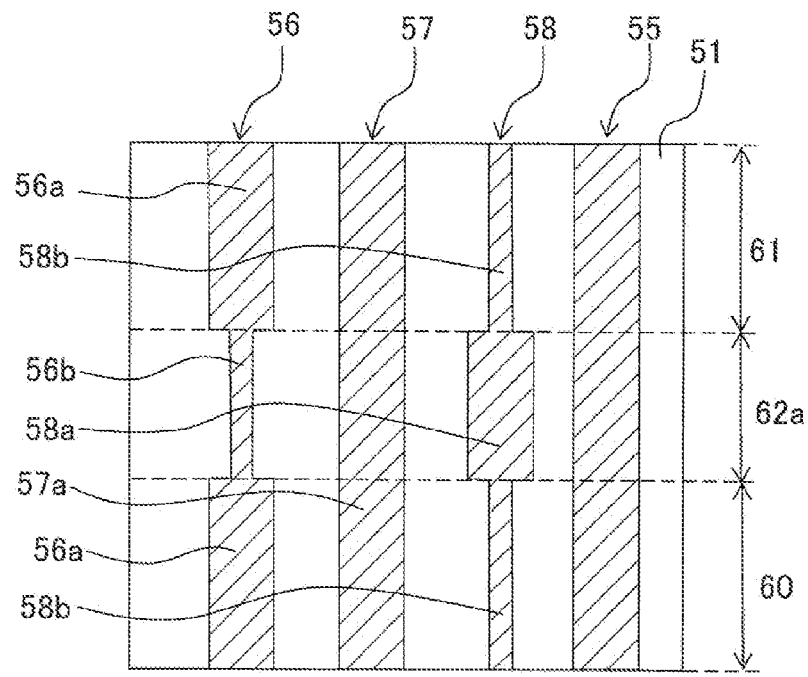
FIG. 6A is a partial enlarged view of part B of FIG. 5.
Figure 6B:
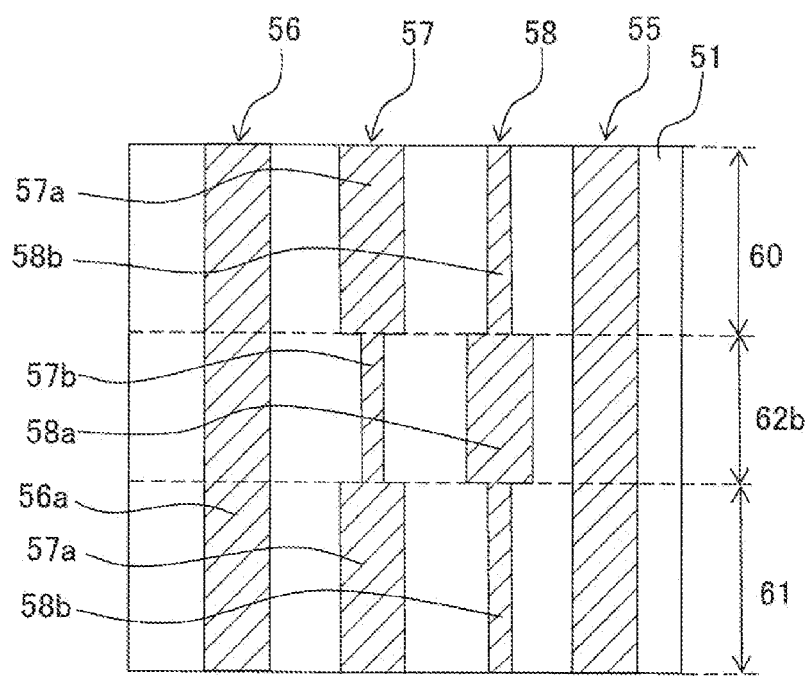
FIG. 6B is a partial enlarged view of part C of FIG. 5.

Next, referring to FIGS. 2, 5, 6A and 6B, the COF 50 will be explained. Further, FIG. 5 shows only part of wires and omits illustration of the rest. Further, the COF shown in FIG. 5 and FIGS. 6A and 6B is in a state of extending straight, being not folded back as shown in FIG. 2.

As shown in FIGS. 2 and 5, the COF 50 has a zonal insulating base material 51 made of a flexible synthetic resin film such as polyimide and the like, input terminals 53 formed on both ends of the base material 51 in the length direction, a plurality of wires 54 to 58 formed of a metallic material such as copper and the like on one surface of the base material 51, and a plurality of bumps 46. Further, two drivers IC 52 are installed on the one surface with the formed wires 54 to 58 of the COF 50 to drive the actuator 32.

Each of the input terminals 53 includes a plurality of terminals 59 formed to align in the width direction of the base material 51, and predetermined electric potentials are inputted to the plurality of terminals 59, respectively. Further, among the plurality of terminals 59, terminals 59b represent those at one end of the COF 50 in the width direction (the left end in FIG. 5), terminals 59c represent those adjacent to the terminals 59b, terminals 59d represent those adjacent to the terminals 59c, and terminals 59a represent the rest.

The wires 54 are formed on one surface of the base material 51, and electrically connect each driver IC 52 and the terminals 59a of the corresponding input terminal 53. The wires 55 are also formed on the one surface of the base material 51, and electrically connect the drivers IC 52 and the bumps 46.

The wire 56 is also formed on the one surface of the base material 51 to extend in the transport direction on one side (on the left in FIG. 5) to the region of arranging the plurality of bumps 46 in the width direction, and electrically connects the two terminals 59b of the input terminals 53 at the both ends of the base material 51 in the length direction.

The wire 57 is formed adjacent to the wire 56 also on the one surface of the base material 51 to extend in the transport direction on one side (on the left in FIG. 5) to the region of arranging the plurality of bumps 46 in the width direction, and electrically connects the two terminals 59c of the input terminals 53.

The wire 58 is formed adjacent to the wire 57 also on the one surface of the base material 51 to extend in the transport direction on one side (on the left in FIG. 5) to the region of arranging the plurality of bumps 46 in the width direction, and electrically connects the two terminals 59d of the input terminals 53.

The plurality of bumps 46 are arranged in planar form in the center portion of the base material 51 in the length direction in respective correspondence with the plurality of individual electrodes 42 to form a connection region 60. This connection region 60 of the base material 51 is arranged to cover the upper surface of the actuator 32, where the plurality of bumps 46 are connected with the plurality of input contact points 43 connected to the individual electrode's 42 of the actuator 32. Further, although the plurality of bumps 46 are all provided in the connection region 60 in reality, for simplifying the figure, FIG. 2 shows only part of the bumps 46 and their connected input contact points 43.

Further, the two end portions of the base material 51, which continue into the connection region 60 and on which the drivers IC 52 are installed, are folded back on the opposite side to the actuator 32 (the upper side) to face the upper surface of the actuator 32 across the connection region 60 and apart from the connection region 60. By virtue of this, as shown in FIG. 2, the COF 50 is shaped into an approximate elliptic ring (an upward open C-shape). Further, explanations will be made hereinbelow by defining the regions of the base material 51 facing the connection region 60 as opposite regions 61, and the fold regions linking the connection region 60 and the opposite regions 61 as fold regions 62a and 62b respectively.

Then, a substrate support member 67 is placed inside the COF 50 formed into the approximate elliptic ring. As shown in FIG. 2, the substrate support member 67 contacts with the lower surfaces of the opposite regions 61 in a posture parallel to the upper surface of the actuator 32, and is bonded thereto with an unshown adhesive. Then, the substrate support member 67 supports from below the opposite regions 61 of the COF 50 spaced apart from the connection region 60.

Then, the FPC 65 is commonly superimposed on and connected to the two input terminals 53 provided at both ends of the COF 50 (in the opposite regions 61). By virtue of this, the ink-jet head 3 is restrained from growing in size in the transport direction, while the two input terminals 53 are connectable to the single piece of the FPC 65. The FPC 65 is drawn out from the COF 50 in the horizontal direction (the scanning direction), and connected to an unshown control board of the printer 1. The control signal and the supply voltage for the drivers IC 52 from the control board are inputted to the drivers IC 52 of the COF 50 via the FPC 65. Then, based on this control signal, the drivers IC 52 generate a drive pulse signal due to the drive potential and the ground potential, and supply the same to input contact points 43 connected to the plurality of individual electrodes 42 of the actuator 32 via the wires 55.

As shown in FIGS. 6A and 6B, the wire 55 connecting the drivers IC 52 and the bumps 46 has a uniform width throughout the region in the length direction such that it will not break up even if the base material 51 is folded with not less than a predetermined curvature. In this embodiment, the width of the wire 55 is about 15 µm and the predetermined curvature is provided so that the radius of the curvature is about 0.1 mm. Further, although not shown in FIGS. 6A and 6B, the wires 54 connecting the terminals 59a of the input terminals 53 and the drivers IC 52 also have the same width as the wire 55 throughout the region in the length direction.

The wire 56 forms wire segments 56a (non-inspection segments) of the same width as the wires 54 and 55 in the wiring portions formed in the connection region 60, the opposite regions 61, and the fold region 62b. Further, in the wiring portion formed in the fold region 62a, an inspection segment 56b is formed to extend in the folding direction, and has a narrower width than the wire segments 56a such that it breaks up when folded with not less than the predetermined curvature. In this embodiment, the width of the inspection segment 56b is about 10 µm.

The wire 57 forms wire segments 57a (non-inspection segments) of the same width as the wires 54 and 55 in the wiring portions formed in the connection region 60, the opposite regions 61, and the fold region 62a. Further, in the wiring portion formed in the fold region 62b, an inspection segment 57b is formed to extend in the folding direction, and has the same narrow width as the inspection segment 56b. That is, the wires 56 and 57 are provided with the inspection segments 56b and 57b in different portions of the two fold regions 62a and 62b from each other, respectively.

The wire 58 forms wire segments 58a (non-inspection segments) of the same width as the wires 54 and 55 in the wiring portions formed in the two fold regions 62a and 62b. Further, in the wiring portions formed in the connection region 60 and the opposite regions 61, inspection segments 58b are formed, respectively, and have the same narrow width as the inspection segments 56b and 57b.

Then, as shown in FIG. 2, in the folded posture of the COF 50 arranged on the upper surface of the actuator 32, because the inspection segments 56b and 57b of the wires 56 and 57 are broken up due to the two fold regions 62a and 62b folded with a predetermined curvature, the terminals 59b and 59c of the input terminals 53 on both sides are not conductive through the inspection segments 56b and 57b of the wires 56 and 57. Further, except the two fold regions 62a and 62b, the connection region 60 and the opposite regions 61 are not folded, and thus the inspection segments 58b are not broken up. Thereby, the terminals 59d of the input terminals 53 on both sides are conductive through the inspection segments 58b of the wire 58.

Figure 7A:
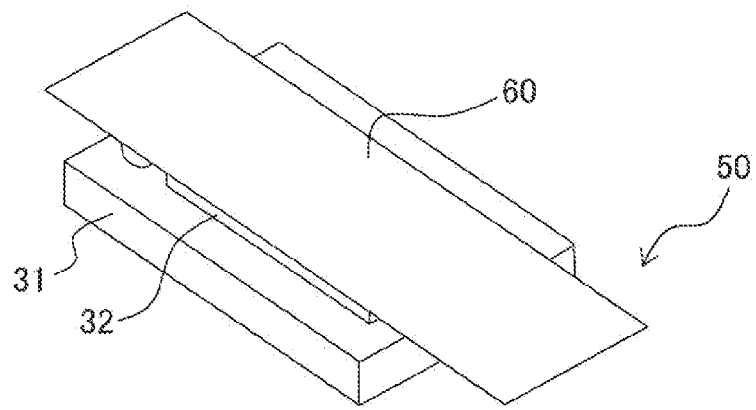
FIGS. 7A to 7C are diagrams for explaining an assembly process of the COF.
Figure 7B:
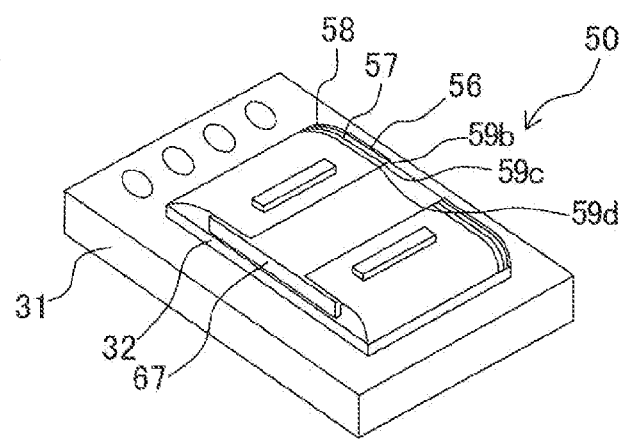
Figure 7C:
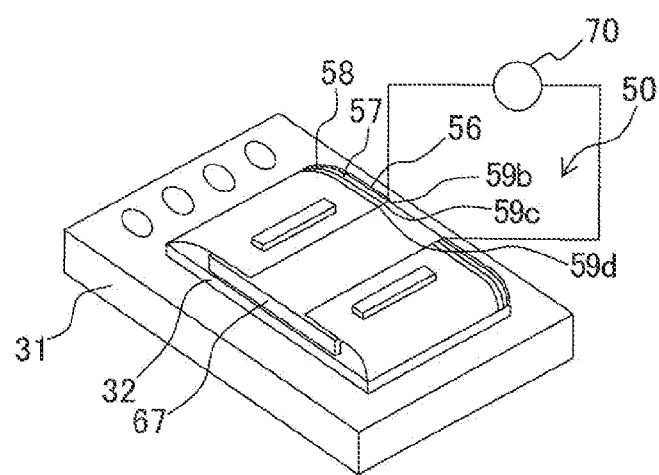

Next, referring to FIGS. 7A to 7C, explanations will be made with respect to a process for manufacturing the aforementioned ink-jet head 3. Further, since each of the processes for manufacturing the flow passage unit 31, the actuator 32 and the COF 50 is heretofore known conventionally, explanations therefor will be omitted. The following explanations will concern the process after manufacturing the flow passage unit 31, the actuator 32 and the COF 50 through different processes, respectively. FIGS. 7A to 7C only show the wires 56 to 58 among the plurality of wires 54 to 58, but omit illustration of the other wires 54 and 55.

First, after bonding the vibration plate 40 of the actuator 32 with an adhesive onto the upper surface of the flow passage unit 31 in which the plurality of pressure chambers 34 are formed and, as shown in FIG. 7A, the input contact points 43 are connected to the bumps 46 by placing the connection region 60 in which the plurality of bumps 46 of the COF 50 are formed onto the upper surface of the actuator 32 on which the plurality of input contact points 43 are formed (a connection process).

Thereafter, as shown in FIG. 7B, the upper surface of the substrate support member 67 is bonded to the lower surface of the COF 50 with the adhesive by placing the substrate support member 67 above the upper surface of the actuator 32, and then folding back both side portions of the COF 50 in the length direction onto the upper surface of the substrate support member 67 with a predetermined curvature (a folding process).

Subsequently, as shown in FIG. 7C, conduction is inspected for the wire 56 extending in the length direction of the base material 51 (a first inspection process). As a method for inspecting conduction, by utilizing a tester 70 and applying a predetermined electric potential to one of the two terminals 59b connected respectively with both ends of the wire 56, if the same potential can be measured at the other terminal, then the wire 56 is conductive. Alternatively, various inspection methods heretofore known conventionally may as well be utilized such as the resistance value between the two terminals 59b is measured, and if it is almost zero ohm, then the wire 56 is conductive; etc.

At this time, if the wire 56 is detected to be insulating, then it is possible to determine that the fold region 62a, which is provided with the inspection segment 56b of the wire 56, is folded. On the other hand, if the wire 56 is detected to be conductive, then it is possible to determine that the fold region 62a is not folded with not less than a predetermined curvature. In this manner, it is possible to inspect whether or not the COF 50 is folded at the fold region 62a.

Thereafter, the same method is utilized to inspect the conduction of the wire 57 extending in the length direction of the base material 51 (a second inspection process), and thereby determining whether or not the fold region 62b, which is provided with the inspection segment 57b of the wire 57, is folded. By virtue of this, it is possible to inspect whether or not the COF 50 is folded at the fold region 62b provided with the inspection segment 57b of the wire 57.

Thereafter, the same method is utilized to inspect the conduction of the wire 58 extending in the length direction of the base material 51 (a third inspection process). At this time, if the wire 58 is detected to be conductive, then it is possible to determine that the connection region 60 and opposite regions 61, which are provided with the inspection segments 58b of the wire 58, are not folded. On the other hand, if the wire 58 is detected to be insulating, then it is possible to determine that the connection region 60 and the opposite regions 61 are folded. In this manner, it is possible to inspect whether or not the COF 50 is folded at other regions than the two fold regions 62a and 62b.

From these three inspection results, if the wires 56 and 57 are detected to be insulating while the wire 58 is detected to be conductive, then the base material 51 is folded at the two fold regions 62a and 62b but not folded at the connection region 60 and the opposite regions 61. Accordingly, the COF 50 is determined to be folded correctly and thus assembled in a correct posture.

On the other hand, if either the wire 56 or the wire 57 is detected to be conductive, or the wire 58 is detected to be insulating, then the base material 51 is not folded at one of the two fold regions 62a and 62b, or folded at the connection region 60 and the opposite regions 61. Accordingly, the COF 50 is determined to be not folded correctly and thus not assembled in a correct posture (a determination process). Further, the wires 56 to 58 in the embodiment correspond to the inspection wires in accordance with the present invention. Then, with the COF 50 being assembled in a correct posture, the manufacturing of the ink-jet head 3 is completed. Further, the thin wire segments of the wire 58, which are subject to breakup when folded with not less than the predetermined curvature, may as well not be formed throughout the entire connection region 60 and the opposite regions 61 but be formed only in regions which are likely to be folded but should not be folded (for example, regions on both sides to the fold region 62a, and regions on both sides to the fold region 62b).

By virtue of this, by inspecting the postures of the two fold regions 62a and 62b of the COF 50 as well as the postures of the connection region 60 and the opposite regions 61, it is possible to accurately determine whether or not the COF 50 is assembled in a correct posture. Further for example, because it is possible to inspect the posture of the COF 50 before carrying out post-processes such as connecting the unshown control board to the COF 50, supposing the COF 50 is folded in an incorrect posture as shown in FIG. 2 with the chain double-dashed lines, if the COF 50 can still be reassembled, then it is possible to shorten the time required for the reassembly by inspecting the posture of the COF 50 at an early stage. Further, supposing the COF 50 cannot possibly be reassembled, it is still possible to prevent waste of other members to be assembled in post-processes by inspecting the posture of the COF 50 at an early stage in manufacturing.

Further, by diminishing the widths of the inspection segments 56b to 58b of the wires 56 to 58 to less than those of the wire segments 56a to 58a, it is possible to break up only the inspection segments 56b to 58b provided in the fold regions when the base material 51 is folded with the predetermined curvature.

Next, explanations will be made with respect to a few modifications applying various changes to the embodiment described hereinabove. Note that, however, the constitutive parts or components, which are the same as or equivalent to those of the embodiment, are designated by the same reference numerals, any explanation of which will be omitted as appropriate.

In the embodiment, the folded posture is inspected with the COF 50 folded after connected to the upper surface of the actuator 32 bonded to the flow passage unit 31. However, the COF 50 may as well be folded before connected to the actuator 32, and connected to the actuator 32 after inspecting the folded posture. In this manner, it is possible to inspect the folded posture of the COF 50 even as a single piece in accordance with the present invention. Therefore, inspecting the posture of the COF 50 at an earlier stage in manufacturing prevents waste of more members to be assembled in post-processes.

Further, in the embodiment, whether or not the wires 56 to 58 are broken up is inspected by inspecting the conduction of the inspection segments 56b to 58b of the wires 56 to 58 provided in the COF 50 for inspective purposes. However, being not limited to this, whether or not the wires 56 to 58 are broken up may as well be inspected by, for example, detecting whether or not any ink is jetted from the nozzles 30 of the ink-jet head 3. Hereinbelow, two modifications will be explained. Further, the following explanations relate to methods for inspecting an breakup of the wire corresponding to the wire 56 with the inspection segment 56b in the fold region 62a in the aforementioned embodiment. Explanations for the wires 57 and 58 will be omitted due to the similarities.

(Modification 1)

As shown in FIG. 8, in a flow passage unit 131, other than the ink flow passages including the pressure chambers 34 and nozzles 30 utilized in the recording operation of the aforementioned embodiment, ink flow passages (not shown) including pressure chambers 134 and inspection nozzles 130 are also provided to be utilized only in inspection. Then, in an actuator 132, individual electrodes 142 and input contact points 143 are provided to correspond to the nozzles 130, respectively.

Figure 9:
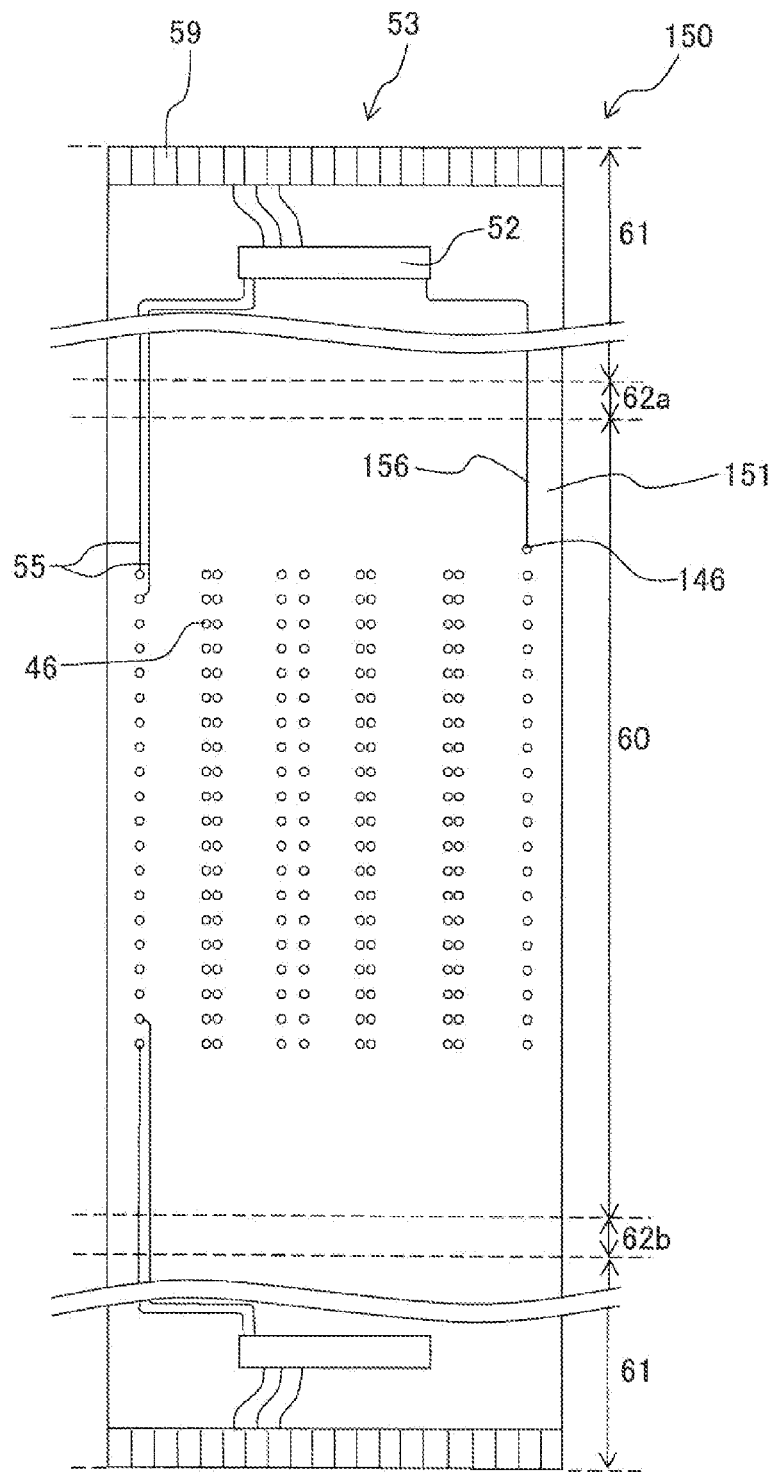
FIG. 9 is a plan view of a COF in accordance with the first modification.

Then, as shown in FIG. 9, a base material 151 of a COF 150 is provided with bumps 146 corresponding to the input contact points 143, and a wire 156 connecting the bumps 146 and the driver IC 52. This wire 156 corresponds to the wire 56 in the aforementioned embodiment, and has an inspection segment of narrower width (not shown) provided in the fold region 62a.

With such a configuration, in order to inspect whether or not the wire 156 is broken up, after the COF 150 is connected to an ink-jet head 103 composed of the flow passage unit 131 and the actuator 132, and folded (after the connection process and the folding process), the driver IC 52 supplies a drive pulse signal to the wire 156. In this case, if the inspection nozzles 130 do not jet any ink, then the inspection segment of the wire 156 is insulating, and thus the wire 156 is broken up. Thereby, it is possible to determine the fold region 62a of the COF 150 to be folded. Further, if the inspection nozzles 130 jet ink, then the inspection segment of the wire 156 is conductive, and thus the wire 156 is not broken up. Thereby, it is possible to determine the fold region 62a of the COF 150 to be not folded. Further, whether or not ink is jetted may be detected by, for example, performing the operation for jetting ink to the recording paper P, and then letting the operator check the recording paper P either visually or with an image sensor. Further, whether or not the inspection nozzles 130 jet ink may as well be directly detected with a sensor.

(Modification 2)

Figure 10:
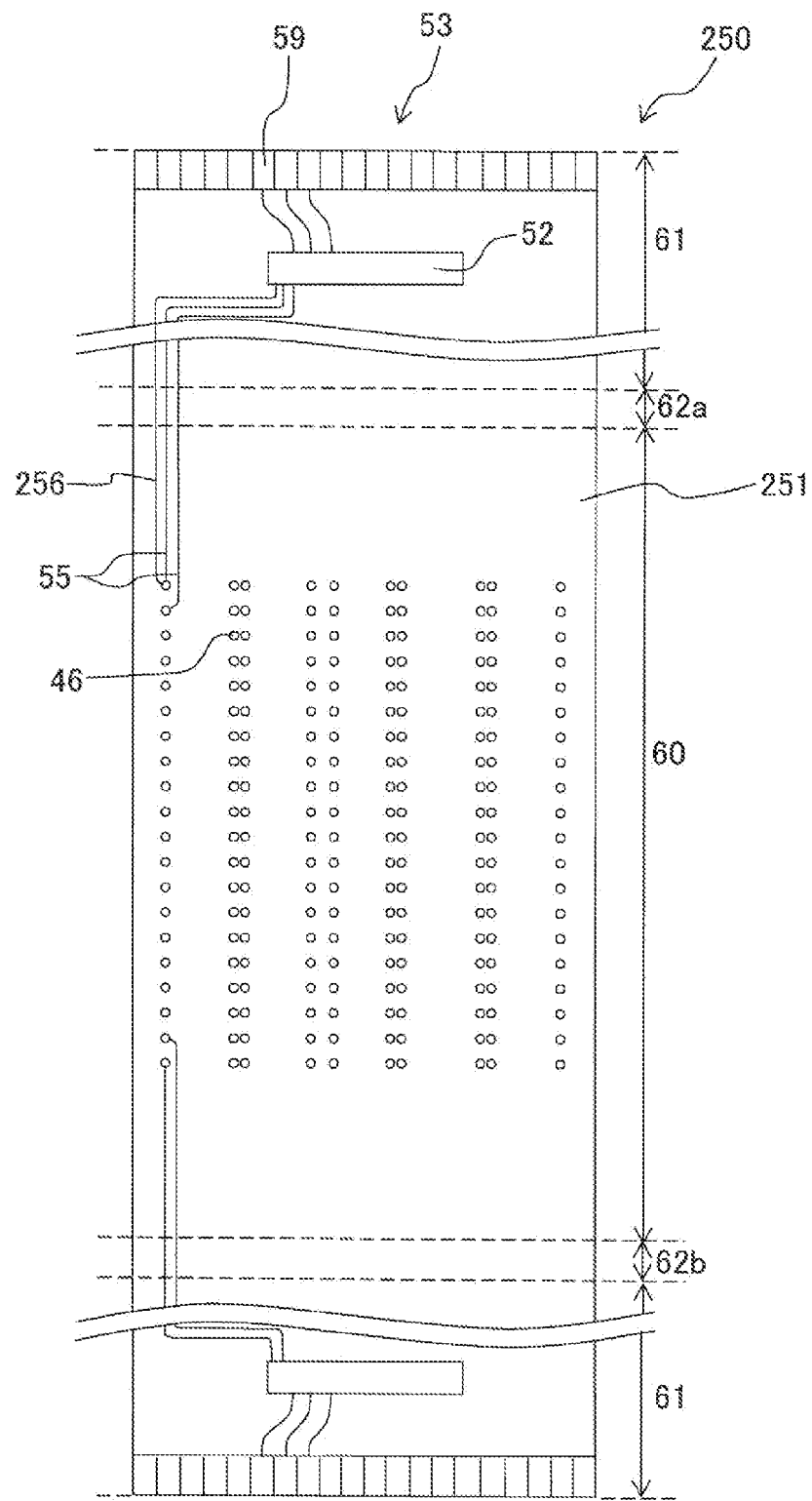
FIG. 10 is a plan view of a COF in accordance with a second modification.

The ink-jet head 3 is the same as that in the aforementioned embodiment. Then, as shown in FIG. 10, on a base material 251 of a COF 250, a wire 256 is provided, and two wires 55 and 256 from the driver IC 52 are commonly connected to one bump 46. This wire 256 corresponds to the wire 56 in the aforementioned embodiment, and has an inspection segment of narrower width (not shown) provided in the fold region 62a.

With such a configuration, in order to inspect whether or not the wire 256 is broken up, after the COF 250 is connected to the ink-jet head 3, and folded (after the connection process and the folding process), the driver IC 52 supplies a drive pulse signal to the wire 256. In this case, if the nozzles 30 do not jet any ink, then the inspection segment of the wire 256 is insulating, and thus the wire 256 is broken up. Thereby, it is possible to determine the fold region 62a of the COF 250 to be folded. Further, if the nozzles 30 jet ink, then the inspection segment of the wire 256 is conductive, and thus the wire 256 is not broken up. Thereby, it is possible to determine the fold region 62a of the COF 250 to be not folded. Further, whether or not ink is jetted is detected in the same manner as in the modification 1.

In the above modifications 1 and 2, in the same manner as in the aforementioned embodiment, it is also possible to inspect whether or not the COF 150 and COF 250 are folded at correct regions and drawn around in correct postures. Further, it is still possible to shorten the input terminals 53 in the width direction without the need to increase the number of the terminals 59 of the input terminals 53.

In the embodiment, on the same surface of the base material 51, there are formed the wires 54 and 55 for driving the ink-jet head 3, and the inspection wires 56 to 58 for inspecting the folded posture of the COF 50. However, the wires 54 and 55 and the inspection wires 56 to 58 may as well be formed on surfaces different from each other. By virtue of this, compared with the surface with the formed wires 54 and 55 of the base material 51, the opposite surface has a larger area in which the inspection wires 56 to 58 are formable. Thereby, it is possible to provide the inspection wires 56 to 58 without increasing the size of the base material 51.

Further, in the embodiment, the inspection segments 56b to 58b of the wires 56 to 58 are made narrower in width than the wire segments 56a to 58a so as to break up when reaching or exceeding a predetermined curvature. However, as long as the inspection segments 56b to 58b are smaller in cross-sectional area than the wire segments 56a to 58a, they may as well be diminished in thickness, for example, and left unchanged in width. Further, the inspection segments 56b to 58b may differ in material from the wire segments 56a to 58a, and be made of a material easy to break up when folded with not less than a predetermined curvature (a material of lower strength, for example).

Figure 11:
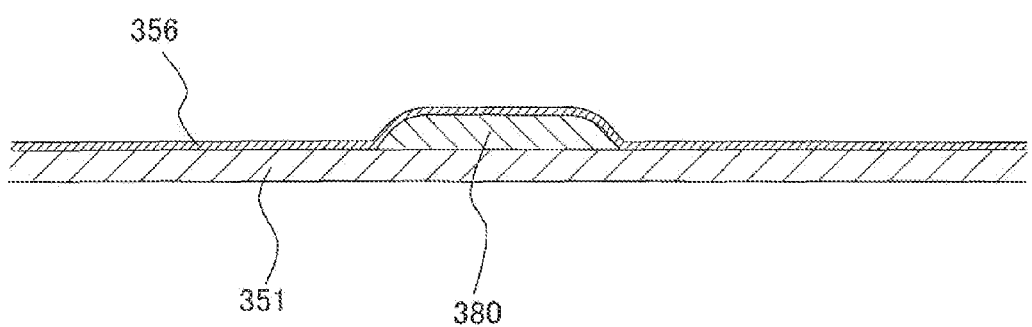
FIG. 11 is a cross-sectional view of a COF in the thickness direction in accordance with a third modification.

Further, instead of adapting wires for easy breakup such as the aforementioned diminishment of part of the wires in width, and the like, when a wire 356 is formed on the surface of a base material 351 as shown in FIG. 11, a projection member 380 may be provided between a part of the wire 356 and the base material 351 to project that part of the wire 356 for the purpose of easy breakup (a third modification). At this time, with the two sides of the base material 351 across the projection member 380 as the centers of folding the projection member 380, if the base material 351 is folded back to the opposite side to the surface provided with the projection member 380, then compared with the case of not providing the projection member 380, a greater tensile force acts on the wire 356 formed on the upper surface of the projection member 380, thereby allowing the wire to break up easily. Further, the projection member 380 and the projected portion of the wire 356 due to the projection member 380 in the third modification correspond to the inspection segment in the present invention.

In addition, in the embodiment, whether or not the COF 50 is folded at the two fold regions 62a and 62b is inspected by inspecting the conduction of the wires 56 and 57 and, furthermore, whether or not the COF 50 is folded at the connection region 60 and opposite regions 61 where it should not be folded is inspected by inspecting the conduction of the wire 58. However, as wires for inspection, omitting the wire 58 and only providing the wires 56 and 57, it is also configurable to only inspect whether or not the COF 50 is folded at the two fold regions 62a and 62b.

Further, in the embodiment, the COF 50 is folded at both sides in the length direction and has the two fold regions 62a and 62b. However, it may as well be folded only at one side and have one fold region, or be folded at three or more places and have three or more fold regions. In these cases, it is possible to inspect whether or not the COF is correctly folded by providing as many wires for inspection as the number of the fold regions and forming inspection segments of the wires for inspection in all fold regions.

Further, although the present invention is applied to the COF 50 utilized in a folded state, it is also possible to apply the present invention to a COF utilized in an unfolded state. In this case, it becomes possible to form inspection segments of the wires for inspection in regions where the COF gets folded easily. By inspecting the conduction of the wires for inspection, if conductive, then it is possible to determine the COF to be not folded at the regions where the COF gets folded easily.

Further, in the embodiment, both ends of the wires 56 and 57 with the inspection segments 56b and 57b provided in the fold regions 62a and 62b are connected to the input terminals 53 at both ends of the base material 51 in the length direction. However, they may as well be connected to one of the input terminals 53.

Further, in the embodiment, the COF 50 is connected to the actuator 32, and sends the control and supply signals from the control board to the drivers IC 52, and the drive pulse signal outputted from the drivers IC 52. However, it may as well be connected to a sensor, for example, and send the output signal of the sensor. That is, the connecting objects of the COF 50 are not limited to actuators, but may be any devices for inputting or outputting electric current such as sensors and the like.

What is claimed is:

1. A flexible wiring substrate comprising:
 a flexible base material;
 a wire provided on the base material; and
 an inspection wire provided on the base material, having an inspection segment which breaks up under a condition that the inspection segment is folded with not less than a predetermined curvature and a non-inspection segment which does not break up under a condition that the non-inspection segment is folded with not less than the predetermined curvature;
 wherein the flexible base material is folded with not less than the predetermined curvature at a region in which the inspection segment of the inspection wire is arranged.

2. The flexible wiring substrate according to claim 1;
 wherein the flexible wiring substrate is configured to be connected to a connection object.

3. The flexible wiring substrate according to claim 1;
 wherein the inspection wire is provided as a plurality of inspection wires; the plurality of inspection wires have a plurality of inspection segments; and the plurality of inspection segments are arranged in a plurality of regions different from one another on the base material, respectively.

4. The flexible wiring substrate according to claim 1;
 wherein the flexible wiring substrate is configured to be connected to a connection object and the flexible wiring substrate is not folded with not less than the predetermined curvature at a region in which the inspection segment of the inspection wire is arranged.

5. The flexible wiring substrate according to claim 1;
 wherein the inspection wire is provided as a plurality of inspection wires; the plurality of inspection wires have a plurality of inspection segments; the plurality of inspection segments are arranged in a plurality of regions different from one another on the base material, respectively; and the flexible wiring substrate is configured to be folded with not less than the predetermined curvature only at a part of the plurality of regions.

6. The flexible wiring substrate according to claim 1;
 wherein the cross-sectional area of the inspection segment of the inspection, wire is smaller than the cross-sectional area of the wire.

7. The flexible wiring substrate according to claim 1;
 wherein the cross-sectional area of the inspection segment of the inspection wire is smaller than the cross-sectional area of the non-inspection segment of the inspection wire.

8. The flexible wiring substrate according to claim 1;
 wherein the wire is provided as a plurality of wires On one surface of the base material;
 and the inspection wire is formed on the other surface of the base material.

* * * * *